United States Patent
Barthelmess et al.

(10) Patent No.: US 6,660,569 B1
(45) Date of Patent: Dec. 9, 2003

(54) METHOD FOR PRODUCING A POWER SEMICONDUCTOR DEVICE WITH A STOP ZONE

(75) Inventors: Reiner Barthelmess, Warstein-Belecke (DE); Hans-Joachim Schulze, Ottobrunn (DE)

(73) Assignee: EUPEC Europaeische Gesellschaft fuer Leitungshalbleiter mbH & Co. KG, Warstein-Belecke (DE)

( * ) Notice: Subject to any disclaimer, the term of this patent is extended or adjusted under 35 U.S.C. 154(b) by 0 days.

(21) Appl. No.: 09/830,326

(22) PCT Filed: Oct. 15, 1999

(86) PCT No.: PCT/EP99/07851

§ 371 (c)(1),
(2), (4) Date: Jul. 30, 2001

(87) PCT Pub. No.: WO00/25356

PCT Pub. Date: May 4, 2000

(30) Foreign Application Priority Data

Oct. 23, 1998 (DE) .......................................... 198 48 985

(51) Int. Cl.$^7$ ............................................. H01L 21/332
(52) U.S. Cl. ........................ 438/133; 438/528; 438/920
(58) Field of Search .................................. 438/133, 138, 438/268, 407, 528, 909, 920

(56) References Cited

U.S. PATENT DOCUMENTS

| | | | | |
|---|---|---|---|---|
| 5,283,202 A | * | 2/1994 | Pike et al. .................. | 438/138 |
| 5,308,789 A | * | 5/1994 | Yoshimura et al. .......... | 438/920 |
| 5,668,385 A | * | 9/1997 | Bauer et al. ................. | 257/139 |
| 5,929,482 A | * | 7/1999 | Kawakami et al. .......... | 257/328 |

FOREIGN PATENT DOCUMENTS

| | | |
|---|---|---|
| DE | 39 37 393 A1 | 5/1991 |
| DE | 40 13 626 C1 | 5/1991 |
| DE | 41 08 394 A1 | 9/1992 |
| DE | 42 23 914 A1 | 1/1994 |
| DE | 43 36 663 A1 | 5/1995 |
| EP | 0 591 788 A2 | 4/1994 |
| EP | 0 621 640 A1 * | 10/1994 |

OTHER PUBLICATIONS

Ghandhi, "VLSI Fabrication Principles, Silicon and Gallium Arsenide", 1983, pp. 300–301, 311–312.*

* cited by examiner

*Primary Examiner*—Chandra Chaudhari
(74) *Attorney, Agent, or Firm*—Laurence A. Greenberg; Werner H. Stemer; Gregory L. Mayback

(57) ABSTRACT

A method of fabricating a silicon power semiconductor with a stop zone includes forming a stop zone by driving oxygen into a semiconductor substrate in a targeted manner and subsequently heating the oxygen with the semiconductor substrate to form thermal donors, and producing, at or near a surface of the semiconductor substrate, an increased oxygen concentration in comparison with other semiconductor regions by ion implantation.

14 Claims, 1 Drawing Sheet

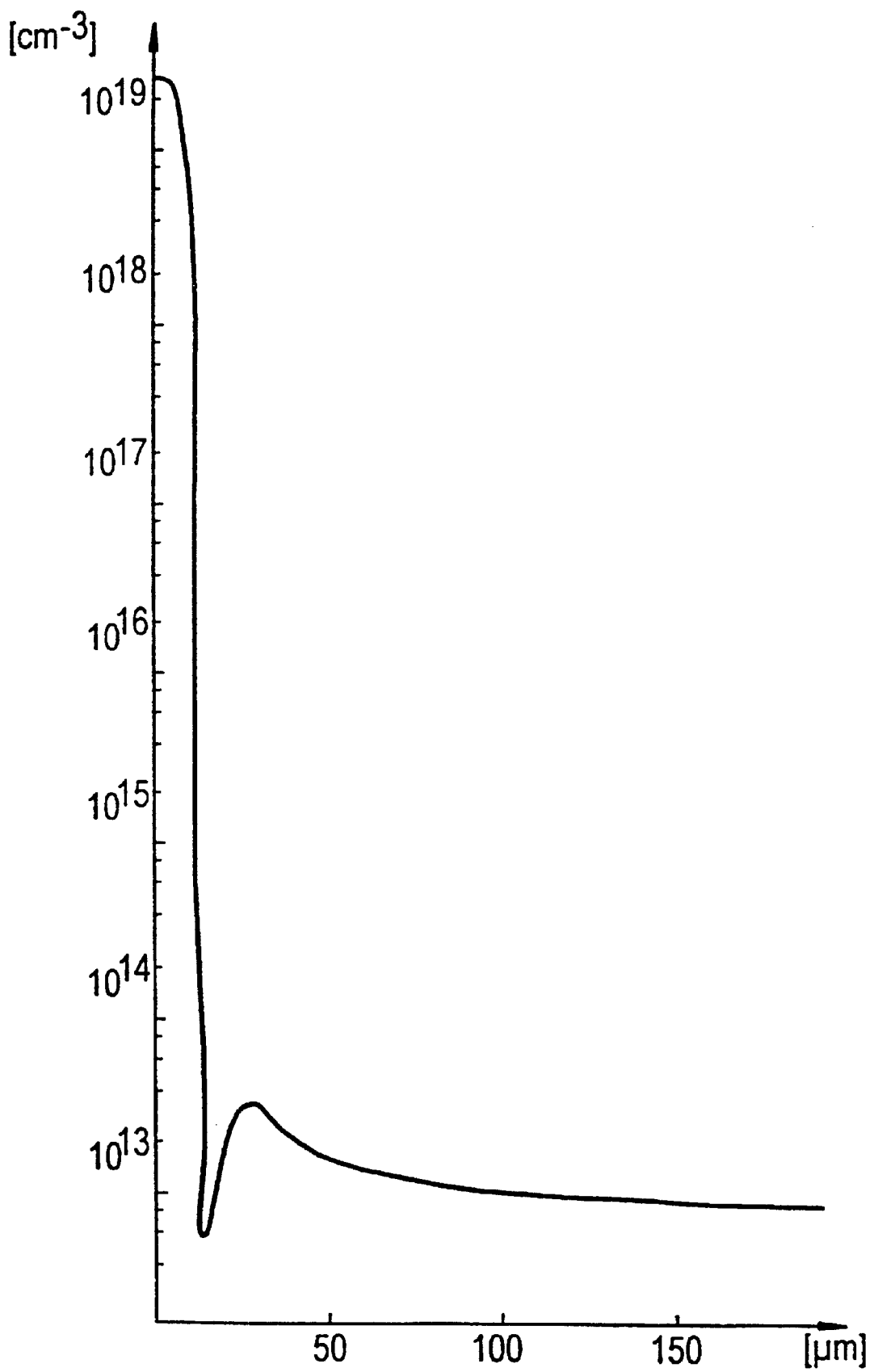

METHOD FOR PRODUCING A POWER SEMICONDUCTOR DEVICE WITH A STOP ZONE

BACKGROUND OF THE INVENTION

Field of the Invention

The present invention relates to a method for fabricating a power semiconductor with a stop zone. The invention is accordingly concerned with the fabrication of power semiconductors.

Power semiconductors have to be able on the one hand to transport large currents and on the other hand to block high voltages, if desired.

In this case, a problem can arise at the junctions between differently doped regions of the power semiconductor. A space charge zone forms here in the event of blocking. The field strength in the space charge zone must be prevented from becoming so high as to result in undesirable breakdowns leading, in the extreme case, to the destruction of the power element. A first approach for avoiding this is to make the power semiconductor very thick. This has the disadvantage that an undesirably large voltage drop, with correspondingly high losses, occurs across the component thickness in the conducting case. A further possibility is to produce a so-called stop zone, which limits the extent of the space charge zone by providing a zone having increased charge carrier density.

Using stop zones, it is possible for the thickness of single-ended blocking components to be significantly reduced without the blocking capability being impaired. In this way, the losses across the semiconductor are reduced particularly in the case of components having a high blocking capability for voltages above 3 kV and with component thicknesses of above 500 micrometers.

To date, stop zones have been formed by targeted doping of phosphorus. For this purpose, phosphorus has firstly been introduced into a region near the semiconductor surface by ion implantation and then been diffused into the silicon base material of the power semiconductor by means of a subsequent drive-in step. However, the low rate of diffusion of phosphorus into silicon requires temperatures of above 1200° C. and diffusion times of above twenty hours in order to produce stop zones. This is associated on the one hand with a long time requirement and a high energy expenditure and on the other hand with high loading on the semiconductor components during production.

It is also known to alter the electronic properties of a semiconductor, as by basic doping of its Si substrate, only by thermal treatment of a finished component. In this case, the oxygen which has passed into all regions of the substrate during the fabrication process is intended to form thermal donors. In this respect, reference is made to DE 39 37 393 C2.

SUMMARY OF THE INVENTION

The object of the present invention consists in providing something new for industrial application.

The way in which this object is achieved is claimed independently. Preferred embodiments of the invention are specified in the dependent claims.

A basic concept of the present invention thus consists in the insight that it is possible to form a spatially narrowly delimited stop zone using oxygen. It has been recognized that the oxygen which is ineffectual per se in the untreated semiconductor substrate can readily be driven in to a desired location in the substrate and only afterwards a thermal donor can be formed by heating the semiconductor with the oxygen, to be precise without the semiconductor properties being fundamentally altered at all locations by oxygen that has migrated in in a non-targeted manner during fabrication of the component. This allows the targeted formation of a stop zone in a precisely defined region.

The oxygen can firstly be enriched near the surface, for instance by oxidation of the semiconductor surface and/or by ion implantation, resulting in an increased oxygen concentration near the surface compared with other semiconductor regions. The oxygen gradient thus present can then be utilized in a further step in order to diffuse the oxygen from the or a location near the surface as far as the desired depth of the stop zone.

During the diffusion step, the substrate is preferably heated to a temperature which results in comparatively rapid indiffusion of the oxygen but still lies below the temperatures which severely load the material, as are necessary in the prior art. At the same time, the temperature can be chosen to be high enough that the oxygen is not already converted into thermal donors before the desired stop zone depth has been reached. This is advantageous because the formation of thermal donors in silicon with oxygen is still not completely understood in all details; it is supposed that the thermal donors result from the formation of a silicon-oxygen complex. However, sufficiently high temperatures prevent the rate of diffusion from being noticeably reduced by such complex formation. Therefore, the temperature during the indiffusion process preferably also lies above about 520° C., since it is possible to reverse the formation of thermal donors by heating to a sufficiently high temperature, so that it can be assumed that at temperatures above about 520° C., particularly above 550° C., the diffusion is also no longer impaired by the formation of thermal donor complexes. The substrate with the oxygen indiffused as far as the desired depth of the stop zone is then heated to a temperature which suffices for forming thermal donors, and is held at such a temperature or in such a temperature range until thermal donors are formed with an appreciably part of the oxygen. A sufficient temperature lies between 400° C. and 500° C., in particular between 420° C. and 500° C., and, in particular, is preferably 450° C. The time during which the oxygen is appreciably converted into thermal donors is typically 15 minutes to 10 hours, in practice times between 30 minutes and 4 hours already having proved sufficient.

The oxygen is preferably driven into the substrate through a region which is p-doped. During the diffusion, part of the oxygen which is driven in at the surface naturally remains in the p-doped region, while the oxygen which actually forms the stop zone diffuses beyond the p-doped region, which may be an emitter, in order to form the actual stop zone adjoining the p-doped region. Consequently, during the thermal conversion, thermal n-type donors are produced in the p-doped region in the same way as in the stop zone. The p-doped region is so highly p-doped that the influence of these thermally produced donors is compensated for.

In typical power semiconductors it will be necessary for the stop zone to be diffused down to a depth of 20–40 micrometers. In view of the diffusion behavior of oxygen in silicon, it is readily possible for the oxygen which remains in the p-doped region at these depths and the thermal n-type donors thus formed to be compensated for without extension by increasing the p-type doping, without negative influences having to be feared.

BRIEF DESCRIPTION OF THE DRAWING

The FIGURE of the drawing is a graph illustrating the charge carrier concentration of a GTO—fabricated by the method of the invention—with a short-circuited anode against the thickness of the semiconductor.

DESCRIPTION OF THE PREFERRED EMBODIMENTS

A predetermined quantity of oxygen is then introduced in a targeted manner into those regions of a p-doped semiconductor region, for example of a p-type emitter, which are near the surface by means of ion implantation. If necessary, surrounding regions into which oxygen is not intended to be implanted are optionally masked in a known manner for this purpose. Suitable masks are photoresist and/or silicon oxide.

The oxygen implanted into the regions near the surface is then driven in to the desired depth by means of a high-temperature step of, for example, 1100° C. over a period of two hours.

The wafer with the power semiconductors that are to be completed is subsequently kept at 450° C. over two hours in order to form the thermal donors.

Using the spreading resistance technique, the doping profile was determined on a power semiconductor fabricated by the method of the present invention. In this case, a GTO component with a short-circuited anode was used. The profile obtained corresponds to that illustrated in the figure of the drawing. In this figure, the density of the free charge carriers is plotted against the depth in the substrate. The p-type emitter is discernible as a region having a high charge density of at most about $10^{19}$ charge carriers/cm$^3$, which falls to the charge carrier density at the p/n junction of about $2*10^{12}$. The charge carrier concentration of the basic doping of approximately $8*10^{12}$ can be discerned asymptotically on the right. Located between these regions is the stop zone fabricated according to the invention at a depth of about 15–30 micrometers. In said stop zone, the charge carrier density rises to approximately $4-6*10^{13}$. This comparatively high charge carrier density prevents the space charge zone from being able to extend to a point deep in the p-type emitter, in other words stops said space charge zone. A punch-through to the emitter and the associated loss in the blocking capability are thus prevented.

Electrical measurements on power semiconductors fabricated by the method of the present invention show that the reverse voltage is increased typically by 20–30% given the same component thickness, and that the turn-off strength also increases, i.e. that the maximum component current that can be turned off is increased. Since the reduction—accompanying the formation of stop zones by means of thermal donors—of the charge carrier lifetime in the stop zone region, in the case of turn-off components such as turn-off thyristors, effects a softer switching behavior, as is also known in the case of other components with vertically inhomogeneous carrier lifetime setting.

What is claimed is:

1. A method of fabricating a power semiconductor with a stop zone, which comprises the steps in the following sequence of:

producing, in a vicinity of a surface of a semiconductor substrate, an increased oxygen concentration in comparison with other semiconductor regions by ion implantation; and then forming a stop zone by driving the oxygen from the vicinity of the substrate into the semiconductor substrate in a targeted manner and subsequently heating the oxygen with the semiconductor substrate to form thermal donors.

2. The method according to claim 1, wherein silicon is used as a starting material for the semiconductor substrate.

3. The method according to claim 1 which further comprises driving the oxygen in the semiconductor substrate by diffusion as far as the stop zone.

4. The method according to claim 3, which further comprises heating the silicon substrate to a temperature of above 520° C. and below 1200° C. during the diffusion step.

5. The method according to claim 1, which further comprises driving the oxygen in the semiconductor substrate by diffusion from a location in a vicinity of the surface of the semiconductor substrate as far as the stop zone.

6. The method according to claim 5, which further comprises heating the silicon substrate to a temperature of above 520° C. and below 1200° C. during the diffusion step.

7. The method according to claim 1, which further comprises heating the substrate to a temperature of between 400° C. and 520° C. during the heating step for forming the thermal donors.

8. The method according to claim 1, which further comprises heating the substrate to a temperature of between 420° C. and 500° C. during the heating step for forming the thermal donors.

9. The method according to claim 1, which further comprises heating the substrate to a temperature of 450° C. during the heating step for forming the thermal donors.

10. The method according to claim 1 which further comprises performing the oxygen driving step by driving oxygen into the semiconductor substrate from a p-doped region of the semiconductor substrate.

11. The method according to claim 10, wherein the p-doped region through which the oxygen diffuses to the stop zone to be formed is sufficiently p-doped to compensate for an influence of thermally produced n-type donors emerging from oxygen not diffused as far as the stop zone during operation.

12. The method according to claim 11, which further comprises producing the stop zone at a depth of between 20 and 40 micrometers.

13. A method of fabricating a power semiconductor with a stop zone, which comprises the steps in the following sequence:

producing, at a surface of a semiconductor substrate, an increased oxygen concentration in comparison with other semiconductor regions by ion implantation; and then forming a stop zone by driving the oxygen from the surface of the substrate into the semiconductor substrate in a targeted manner and subsequently heating the oxygen with the semiconductor substrate to form thermal donors.

14. A method of fabricating a power semiconductor with a stop zone, which comprises the steps in the following sequence:

producing, adjacent a surface of a semiconductor substrate, an increased oxygen concentration in comparison with other semiconductor regions by ion implantation; and then forming a stop zone by driving the oxygen from adjacent the surface of the substrate into the semiconductor substrate in a targeted manner and subsequently heating the oxygen with the semiconductor substrate to form thermal donors.

* * * * *